United States Patent
Wu et al.

(10) Patent No.: US 10,686,105 B2
(45) Date of Patent: Jun. 16, 2020

(54) OPTICAL PACKAGE DEVICE

(71) Applicant: Advanced Semiconductor Engineering, Inc., Kaohsiung (TW)

(72) Inventors: Mei-Yi Wu, Kaohsiung (TW); Ying-Chung Chen, Kaohsiung (TW); Hsin-Ying Ho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/011,555

(22) Filed: Jun. 18, 2018

(65) Prior Publication Data

US 2019/0386187 A1    Dec. 19, 2019

(51) Int. Cl.
| | |
|---|---|
| *H01L 33/56* | (2010.01) |
| *H01L 31/02* | (2006.01) |
| *H01L 31/0203* | (2014.01) |
| *H01L 33/62* | (2010.01) |

(52) U.S. Cl.
CPC ........ *H01L 33/56* (2013.01); *H01L 31/02002* (2013.01); *H01L 31/0203* (2013.01); *H01L 33/62* (2013.01)

(58) Field of Classification Search
CPC .......... H01L 33/56; H01L 33/02002
USPC ............................................................ 257/98
See application file for complete search history.

(56) References Cited

U.S. PATENT DOCUMENTS

| | | | | |
|---|---|---|---|---|
| 2010/0140771 | A1* | 6/2010 | Huang | H01L 21/6835 257/686 |
| 2010/0144101 | A1* | 6/2010 | Chow | H01L 21/561 438/127 |
| 2010/0163892 | A1* | 7/2010 | Liu | H05K 1/0274 257/89 |
| 2012/0244651 | A1* | 9/2012 | Chen | H01L 33/486 438/26 |
| 2013/0147054 | A1* | 6/2013 | Lin | H01L 24/96 257/774 |
| 2013/0175701 | A1* | 7/2013 | Park | H01L 21/568 257/774 |
| 2016/0351463 | A1* | 12/2016 | Chen | H01L 23/3121 |

* cited by examiner

*Primary Examiner* — Igwe U Anya
(74) *Attorney, Agent, or Firm* — Foley & Lardner LLP

(57) ABSTRACT

An optical package device comprises a carrier, a die, a support element, and an encapsulant. The die is on the carrier. The support element is on the carrier and adjacent to the die. The encapsulant covers the die and the support element. The encapsulant has a first top surface over the die and a second top surface adjacent to the first top surface. A ratio of a distance between the first top surface and the second top surface of the encapsulant to a distance between the die and the first top surface of the encapsulant is less than 0.1.

21 Claims, 3 Drawing Sheets

OPTICAL PACKAGE DEVICE

BACKGROUND

1. Technical Field

The present disclosure relates generally to an optical package device, and more particularly, the present disclosure relates to an optical package device including a light emitting device or a light sensing device.

2. Description of the Related Art

With the advancement of electronic or optical technology, electronic or optical products are becoming more compact. Electronic device packages such as optical device packages have specifications on their size or thickness. However, as the thickness decreases, there might be problems such as warpage, coplanarity or die marking (or undercut) issues due to, for example, imbalanced distribution of an encapsulant material.

SUMMARY

In one aspect, according to some embodiments, an optical package device includes a carrier, a die, a support element, and an encapsulant. The die is on the carrier. The support element is on the carrier and adjacent to the die. The encapsulant covers the die and the support element. The encapsulant has a first top surface over the die and a second top surface adjacent to the first top surface. A ratio of a distance between the first top surface and the second top surface of the encapsulant to a distance between the die and the first top surface of the encapsulant is less than 0.1.

In another aspect, according to some embodiments, an optical package device includes a carrier, an optical sensing chip, a support element, and a transparent compound. The optical sensing chip is on the carrier. The support element is on the carrier and adjacent to the optical sensing chip. The transparent compound encapsulates the optical sensing chip and the support element. The transparent compound has a top surface and an undercut portion on the top surface. A thickness of the transparent compound above the optical sensing chip is less than 100 μm.

In yet another aspect, according to some embodiments, an optical package device includes a substrate, an optical sensing chip, a conductive support element, and an encapsulant. The optical sensing chip is on the substrate. The conductive support element is on the substrate and adjacent to the optical sensing chip. The conductive support element surrounds the optical sensing chip. The encapsulant covers the optical sensing chip and the conductive support element.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

Common reference numerals are used throughout the drawings and the detailed description to indicate the same or similar elements. The present disclosure will be more readily understood from the following detailed description taken in conjunction with the accompanying drawings.

DETAILED DESCRIPTION

As the thickness of an electronic or optical package device decreases, warpage or die marking (or undercut) issue may occur due to imbalanced distribution of an encapsulant material within the package. For example, a thickness of the encapsulant around or next to a die may be greater than a thickness of the encapsulant above the die within the package device. Correspondingly, a volume of the encapsulant around the die is greater than a volume of the encapsulant above the die, and thus a shrinkage of the encapsulant around the die is greater than a shrinkage of the encapsulant above the die during, for example, a curing process. The shrinkage difference may result in warpage or die marking issue, wherein a die marking is a dent or an undercut of the encapsulant around the die.

The present disclosure provides an optical package device. In some embodiments, a supporting structure is disposed adjacent to a chip and surrounding the chip, which may reduce the warpage or die marking problem for a thin package device.

Figure 1A:
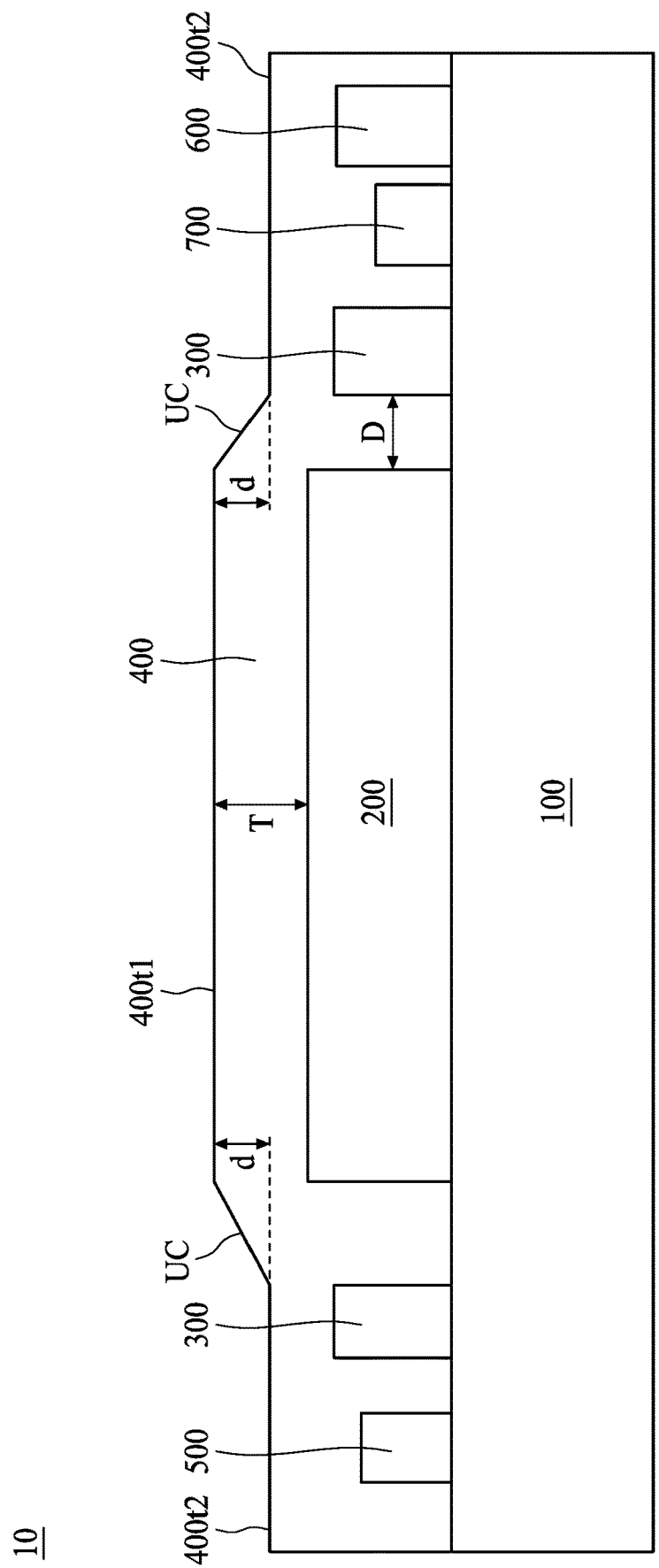
FIG. 1A illustrates a cross-sectional view of an optical package device in accordance with some embodiments of the present disclosure.
Figure 1B:
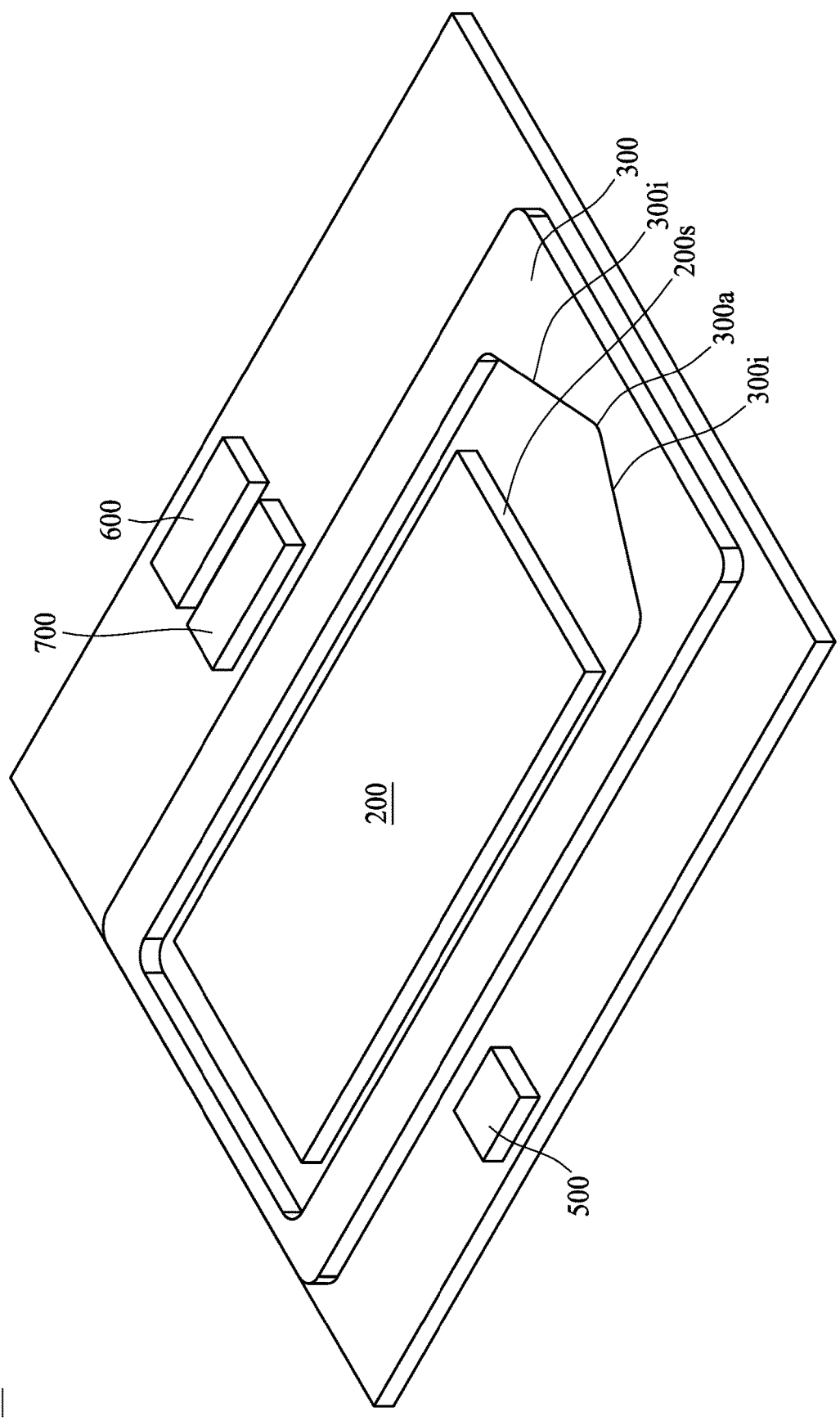
FIG. 1B illustrates a perspective view of an optical package device in accordance with some embodiments of the present disclosure.

FIG. 1A illustrates a cross-sectional view of an optical package device 10 in accordance with some embodiments of the present disclosure. The optical package device 10 includes a carrier 100, a die 200, a support element 300, an encapsulant 400 and a light emitting device 500. FIG. 1B illustrates a perspective view of the optical package device 10 (the encapsulant 400 is omitted for clarity) in accordance with some embodiments of the present disclosure. In some embodiments, the optical package device 10 may be used for a fingerprint identification device.

In some embodiments, the carrier 100 may have a thickness less than 0.3 millimeters (mm) or less than 0.2 mm. The carrier 100 may include, for example, a printed circuit board, such as a paper-based copper foil laminate, a composite copper foil laminate, or a polymer-impregnated glass-fiber-based copper foil laminate. The carrier 100 may include an interconnection structure, such as a plurality of conductive traces or a through via. In some embodiments, the carrier 100 includes a ceramic material or a metal plate. In some embodiments, the carrier 100 includes a substrate, such as an organic substrate or a lead frame. In some embodiments, the carrier 100 includes a two-layer substrate which includes a core layer and a conductive material and/or structure disposed on an upper surface and a bottom surface of the carrier 100. The conductive material and/or structure may include a plurality of traces.

The die 200 is disposed on the carrier 100. The die 200 may include an optical sensing device or an optical sensing chip. In some embodiments, the die 200 includes a light detector which is, for example, a PIN diode (a diode including a p-type semiconductor region, an intrinsic semiconductor region, and an n-type semiconductor region) or a photo-diode or a photo-transistor.

The support element 300 is disposed on the carrier 100 and adjacent to the die 200. In some embodiments, the support element 300 is disposed by a conductive material (such as a conductive adhesive or a conductive paste) and is electrically connected to the carrier 100. In some embodiments, a distance D between the support element 300 and the die 200 is equal to or less than 500 micrometers (μm). In some embodiments, if the distance between the support element 300 and the die 200 is greater than 500 μm, a die marking or undercut may occur on a top surface of the encapsulant 400 due to the difference between a volume of the encapsulant 400 around the die 200 and a volume of the encapsulant 400 above the die 200. In some embodiments, a height of the support element 300 is equal to or less than a height of the die 200. Alternatively, the height of the support element 300 can be greater than the height of the die 200. In some embodiments, the support element 300 is electrically conductive. In some embodiments, the support element 300 includes a metal portion. In some embodiments, the support element 300 may reduce warpage of the optical package device 10.

As shown in FIG. 1B, the support element 300 may have a ring shape and surrounds the die 200. The support element 300 has a surface 300i (for example, an inner surface 300i) facing a surface 200s (for example, a side surface 200s) of the die 200. The surface 300i is inclined to the surface 200s and extends from an edge or a corner of the die 200 away from the die 200. As shown in FIG. 1B, the support element 300 may have another surface 300j (for example, another inner surface 300j). The surface 300j is inclined to the surface 200s of the die 200 and extends from another edge or corner of the die 200 away from the die 200. The surface 300i and the surface 300j forms or defines an angle 300a. In some embodiments, the angle 300a is disposed toward a direction where an encapsulant (for example, the encapsulant 400 in FIG. 1A) flows in (or an inflow direction of an encapsulant), which may improve the flowability of the encapsulant and reduce voids during a molding process when manufacturing the optical package device 10. Alternatively, in some embodiments, the support element 300 may not have an inner surface inclined to any sidewall or side surface of the die 200, and a void may occur between the support element 300 and the die 200 during a molding process.

Figure 1C:
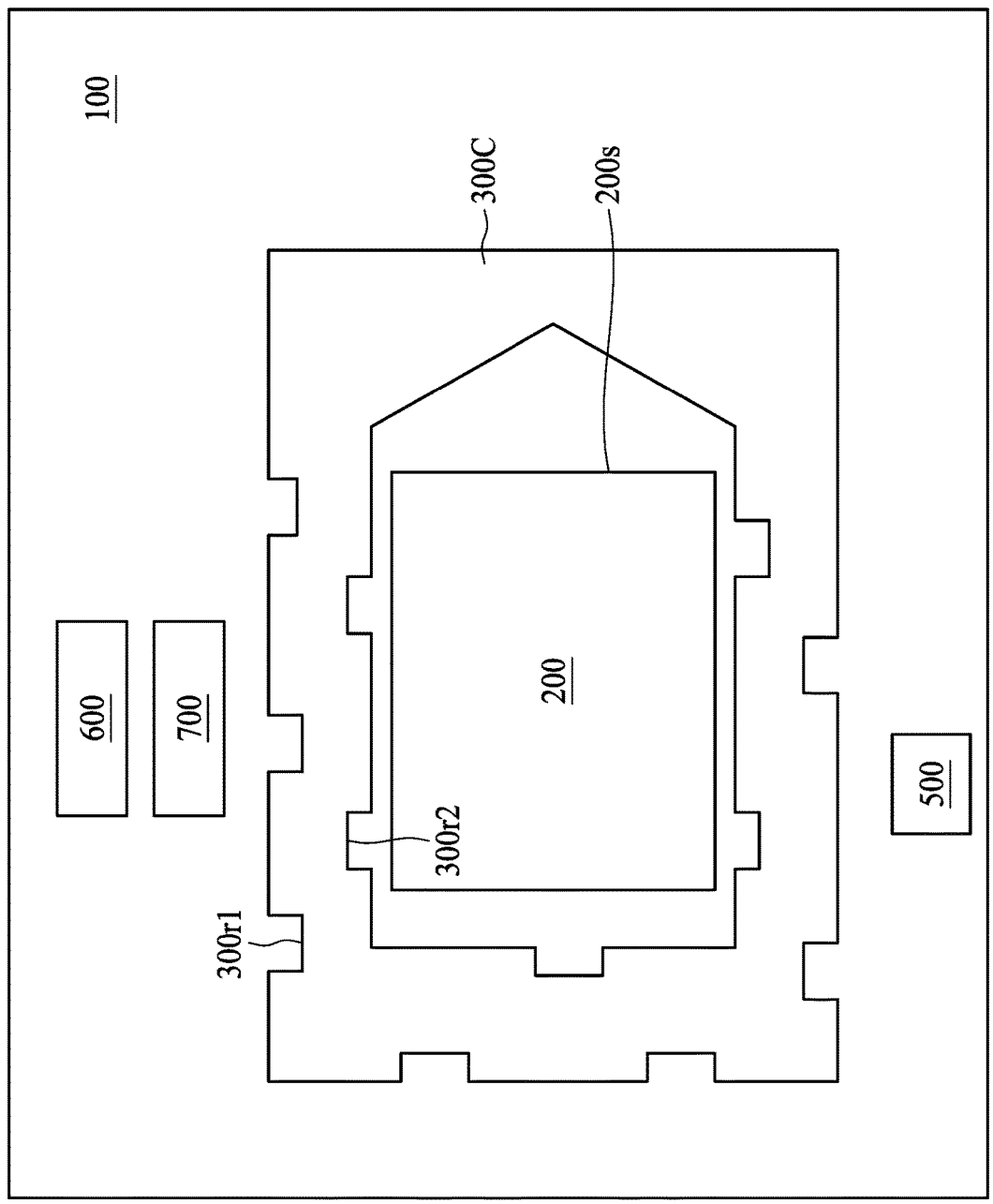
FIG. 1C illustrates a top view of an optical package device in accordance with some embodiments of the present disclosure.

FIG. 1C illustrates a top view of an optical package device 20 in accordance with some embodiments of the present disclosure. The optical package device 20 may have similar properties as those of the optical package device 10 in FIG. 1A and FIG. 1B. One of the differences between the optical package device 20 and the optical package device is that, as shown in FIG. 1C, the optical package device 20 has a support element 300C that has several recesses 300r1 on or recessed from an outer surface or an outer periphery of the support element 300C. The support element 300C may also have several recesses 300r2 on or recessed from an inner surface of the support element 300C that faces the die 200. In some embodiments, the recesses of the support element 300C are configured to enhance the combination or adhesion between the support element 300C, the carrier 100 or the encapsulant 400 (which is omitted in FIG. 1C for clarity), and a delamination between the support element 300C and the carrier 100 or between the support element 300C and the encapsulant 400 may be prevented.

As shown in FIG. 1A, the encapsulant 400 covers or encapsulates the die 200 and the support element 300. The encapsulant 400 has a surface 400t1 (for example, a first top surface 400t1) and a surface 400t2 (for example, a second top surface 400t2). The surface 400t1 is over or above the die 200. The surface 400t2 is adjacent to the surface 400t1. In the embodiment shown in FIG. 1A, the surface 400t1 and the surface 400t2 are not coplanar and define an undercut portion UC of the encapsulant 400. The undercut portion UC is at least partially overlapped with a gap or a space between the die 200 and the support element 300 from a top view perspective. In FIG. 1A, the undercut portion UC surrounds the die 200 and has a uniform depth d. In other embodiments, the undercut portion UC may have several different depths around the die 200.

In some embodiments, the encapsulant 400 includes a transparent material or is a clear compound. In some embodiments, the encapsulant 400 includes no filler. In some embodiments, the encapsulant 400 includes a light transmitting compound. In some embodiments, the encapsulant 400 includes an epoxy resin. In some embodiments, the encapsulant 400 has a coefficient of thermal expansion (CTE) of about 66 ppm/° C. In some embodiments, the encapsulant 400 has a coefficient of thermal expansion (CTE) greater than 66 ppm/° C.

In some embodiments, a distance T between the die 200 and the surface 400t1 of the encapsulant 400 (which may also be a thickness of the encapsulant 400 above the die 200) is equal to or less than 100 μm. In some embodiments, the distance T is less than 150 μm. In some embodiments, a distance d between the surface 400t1 and the surface 400t2 of the encapsulant 400 (which may also be the depth of the undercut portion UC) is equal to or less than 10 μm. In some embodiments, the distance d is between about 4 μm and about 10 μm. In some embodiments, a ratio of the distance d to the distance T is equal to or less than 0.1. In some embodiments, the above features or designs about the distance T or the distance d are realized or achieved by the support element 300. In some circumstances, a die marking issue is considered to be present if the distance d is greater than 10 μm, or if a ratio of the distance d to the distance T is greater than 0.1. In some circumstances, when the distance d is equal to or less than 10 μm, or when a ratio of the distance d to the distance T is equal to or less than 0.1, it is considered that the die marking issue is reduced or eliminated.

The light emitting device 500 is disposed on the carrier 100. A portion of the support element 300 is between the light emitting device 500 and the die 200. For example, the light emitting device 500 is spaced apart from the die 200 by the support element 300. In some embodiments, the light emitting device 500 is configured such that a light emitted by the light emitting device 500 is reflected by an external object (such as an approaching finger) and detected by the die 200 (which may include an optical sensing device). In some embodiments, the undercut portion UC of the encapsulant 400 with a depth d less than 10 μm may improve the light detecting performance of the optical package device 10.

As shown in FIG. 1A, 1B or 1C, the optical package device 10 or the optical package device 20 may include an electronic component 700 and a controller 600. The electronic component 700 may be configured to detect a variation in a capacitance of the support element 300. The controller 600 may include a device control circuit electrically connected to the support element 300. The controller 600 may be configured to control the light emitting device 500 according to a detection result generated by the electronic component 700. In some embodiments, the controller 600 may include a wake up chip or die which turns on the light emitting device 500 when the electronic component 700 detects a capacitance variation of the support element 300, which may be resulted by an approaching finger of a user. For example, in the case that the optical package device 10 is used to detect or identify fingerprint, when a user's finger is close to the support element 300, electrical charges may transfer from the finger to the support element 300 through the encapsulant 400 to change the capacitance of the support element 300. The electronic component 700 can detect the capacitance variation of the support element 300 and transmit the detection result to the controller 600, which can then turn on the light emitting device 500. With such configuration, the light emitting device 500 does not need to be turned on all the time and power consumption can be reduced.

The arrangement of the die 200, the support element 300, the light emitting device 500, the controller 600, or the electronic component 700 illustrated above are by way of examples and can be rearranged according to different applications.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a difference between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical package device, comprising:
    a carrier;
    a die on the carrier;
    a support element on the carrier and adjacent to the die; and
    an encapsulant covering the die and the support element, the encapsulant having a first top surface over the die and a second top surface adjacent to the first top surface,
    wherein a ratio of a distance between the first top surface and the second top surface of the encapsulant to a distance between the die and the first top surface of the encapsulant is less than 0.1, and wherein the support element has an inner surface facing a side surface of the die and inclined to the side surface of the die.

2. The optical package device of claim 1, wherein the encapsulant includes a transparent material.

3. The optical package device of claim 1, wherein the die includes an optical sensing device.

4. The optical package device of claim 1, wherein the support element surrounds the die.

5. The optical package device of claim 1, wherein the support element has an inner surface extending from an edge of the die away from the die.

6. The optical package device of claim 1, wherein the support element includes a metal portion.

7. The optical package device of claim 1, further comprising a device control circuit electrically connected to the support element.

8. The optical package device of claim 1, wherein a distance between the support element and the die is equal to or less than 500 micrometers (µm).

9. The optical package device of claim 1, wherein the distance between the die and the first top surface of the encapsulant is less than 100 µm.

10. The optical package device of claim 1, wherein the distance between the first top surface of the encapsulant and the second top surface of the encapsulant is equal to or less than 10 µm.

11. The optical package device of claim 10, wherein the distance between the first top surface of the encapsulant and the second top surface of the encapsulant is between about 4 μm and about 10 μm.

12. The optical package device of claim 1, further comprising a light emitting device on the carrier, wherein a portion of the support element is between the light emitting device and the die.

13. The optical package device of claim 1, wherein the first top surface and the second top surface of the encapsulant define an undercut portion of the encapsulant, and the undercut portion is at least partially overlapped with a gap between the die and the support element from a top view perspective.

14. An optical package device, comprising:
a carrier;
an optical sensing chip on the carrier;
a support element on the carrier and adjacent to the optical sensing chip; and
a transparent compound encapsulating the optical sensing chip and the support element, the transparent compound having a top surface and an undercut portion on the top surface,
wherein a thickness of the transparent compound above the optical sensing chip is less than 100 μm.

15. The optical package device of claim 14, wherein the support element surrounds the optical sensing chip and a height of the support element is less than a height of the optical sensing chip.

16. The optical package device of claim 14, wherein the support element has an inner surface facing the optical sensing chip and extending away from the optical sensing chip.

17. The optical package device of claim 14, wherein a depth of the undercut portion is equal to or less than 10 μm.

18. The optical package device of claim 17, wherein the depth of the undercut portion is between about 4 μm and about 10 μm.

19. An optical package device, comprising:
a substrate;
an optical sensing chip on the substrate;
a conductive support element on the substrate and adjacent to the optical sensing chip, the conductive support element surrounding the optical sensing chip, wherein the conductive support element protrudes from the substrate;
an encapsulant covering the optical sensing chip and the conductive support element; and
an electronic component configured to detect a variation in a capacitance of the conductive support element.

20. The optical package device of claim 19, further comprising a controller for controlling the light emitting device according to a detection result generated by the electronic component.

21. The optical package device of claim 19, further comprising a light emitting device spaced apart from the optical sensing chip by the conductive support element.

* * * * *